(12) United States Patent
Ohnuma

(10) Patent No.: US 6,928,636 B2
(45) Date of Patent: Aug. 9, 2005

(54) RULE BASED OPC EVALUATING METHOD AND SIMULATION-BASED OPC MODEL EVALUATING METHOD

(75) Inventor: Hidetoshi Ohnuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 148 days.

(21) Appl. No.: 10/332,631

(22) PCT Filed: May 10, 2002

(86) PCT No.: PCT/JP02/04579

§ 371 (c)(1),
(2), (4) Date: Jan. 10, 2003

(87) PCT Pub. No.: WO02/093259

PCT Pub. Date: Nov. 21, 2002

(65) Prior Publication Data

US 2003/0149955 A1 Aug. 7, 2003

(30) Foreign Application Priority Data

May 10, 2001 (JP) ........................ 2001-139719

(51) Int. Cl.$^7$ ............................................. G06F 17/50
(52) U.S. Cl. .............................. 716/21; 716/19; 716/20; 703/14
(58) Field of Search ............................... 716/4, 19, 20, 716/21; 703/14; 438/14

(56) References Cited

U.S. PATENT DOCUMENTS

| | | | |
|---|---|---|---|
| 5,862,058 A | 1/1999 | Samuels et al. | 716/21 |
| 5,879,844 A | 3/1999 | Yamamoto et al. | 430/30 |
| 6,077,310 A | 6/2000 | Yamamoto et al. | 716/19 |
| 6,128,067 A | 10/2000 | Hashimoto | 355/52 |
| 6,243,855 B1 | 6/2001 | Kobayashi et al. | 440/76 |
| 6,303,251 B1 | 10/2001 | Mukai et al. | 430/5 |
| 6,562,638 B1 * | 5/2003 | Balasinski et al. | 438/14 |
| 6,665,858 B2 * | 12/2003 | Miyazaki | 716/21 |

FOREIGN PATENT DOCUMENTS

| | | |
|---|---|---|
| JP | 06-19115 | 1/1994 |
| JP | 09-319067 | 12/1997 |
| JP | 10-83064 | 3/1998 |
| JP | 10-239826 | 9/1998 |
| JP | 11-168065 | 6/1999 |
| JP | 11-184064 | 7/1999 |
| JP | 11-218899 | 8/1999 |
| JP | 11-218900 | 8/1999 |
| JP | 2000-3028 | 1/2000 |
| JP | 2000-49072 | 2/2000 |
| JP | 2000-292903 | 10/2000 |
| JP | 2000-314954 | 11/2000 |
| JP | 2001-13669 | 1/2001 |
| JP | 2001-14376 | 1/2001 |
| JP | 2001-66759 | 3/2001 |

* cited by examiner

*Primary Examiner*—Thuan Do
(74) *Attorney, Agent, or Firm*—Sonnenschein, Nath & Rosenthal LLP (57) ABSTRACT

A rule-based OPC evaluating method and a simulation-based OPC model evaluating method for accurately evaluating line width controllability are disclosed. Mask pattern design data about an evaluation-use mask are input to rule-based OPC to obtain correction data about the mask pattern on the evaluation-use mask. An evaluation-use wafer is fabricated based on the correction data thus acquired. Gate patterns on the evaluation-use wafer are measured for size. Based on a simulation-based OPC model having undergone process calibration, simulation data are output corresponding to all gate patterns on the evaluation-use wafer. The measured data about the evaluation-use gate patterns are compared with the simulation data, whereby the rule-based OPC is evaluated.

6 Claims, 7 Drawing Sheets

RULE BASED OPC EVALUATING METHOD AND SIMULATION-BASED OPC MODEL EVALUATING METHOD

TECHNICAL FIELD

The present invention relates to methods for evaluating rule-based OPC techniques and a simulation-based OPC model by which to fabricate an OPC mask for correcting beforehand mask pattern geometries so as to compensate for pattern deformations caused by the optical proximity effect.

BACKGROUND ART

Recent years have witnessed phenomenal advances in the packing density of semiconductor chips involving further miniaturization of gate lengths. The trend has been making it necessary to define mask patterns of which the unit is smaller than the size of the wavelength of light for use by photolithography machines in transferring the patterns from the mask to the wafer.

Accurate definition of mask patterns having line widths less than the wavelength of light is generally implemented using OPC (optical proximity correction), a collection of techniques for correcting beforehand the shape of mask patterns, to allow for pattern deformations on the wafer caused by the so-called optical proximity effect. This collection of OPC techniques is also called PPC (process proximity effect correction). A typical OPC tool of this type is rule-based OPC.

Rule-based OPC is implemented as follows: a test-use mask pattern is prepared using test patterns representing all patterns that are permitted by design. The test patterns are transferred through the mask pattern onto the wafer for pattern etching, whereby a test-use wafer is produced.

The pattern geometry on the test-use wafer is then measured. The measured data, together with design data from the test-use mask pattern, are used as a basis for generating rule-based OPC, i.e., a collection of design rules for determining bias data to be added to mask pattern design data. The mask pattern is then corrected using the rule-based OPC. The correction takes place at a mask pattern layout stage in the CAD process. The mask fabricated through OPC is called the OPC mask.

Apart from rule-based OPC, there is another set of corrective techniques called simulation-based OPC.

This type of proximity effect correction involves generating a simulation-based OPC model (also called a kernel or a process model) that represents a pattern transfer process allowing for the optical proximity effect based on the measurements of a limited number of test patterns prepared beforehand. Differences in shape between the mask pattern and the pattern geometry transferred through the mask pattern onto the wafer are simulated by the simulation-based OPC model. The results of the simulation are used to correct the mask pattern.

Today, the ever-finer structures of gate patterns are highlighting so-called space dependency, a phenomenon in which the line widths of gate patterns are significantly affected by pattern-to-pattern spacing, i.e., by the fluctuating distances or spaces between the gate patterns and their adjacent patterns. This typically leads to a deterioration in so-called line width controllability of the gate patterns.

Under these circumstances, what is important is precisely to analyze how viable line width controllability is in evaluating the above-mentioned rule-based OPC and simulation-based OPC model.

Conventionally, line width controllability is analyzed for viability as follows: an evaluation-use mask is initially produced based on rule-based OPC or on a simulation-based OPC model. An evaluation-use wafer is then fabricated using the evaluation-use mask. The line widths of gate patterns on this wafer are measured and checked for errors and deviations with respect to space dimensions.

Since there exist a huge number of gate patterns on the evaluation-use wafer, it is impossible in practice to measure the line widths of all these patterns. Instead, some of the gate patterns are selected and measured for line widths. The trouble is that it is difficult to determine whether such selectively measured data are valid in representing the gate patterns on the evaluation-use wafer. As a result, the line width controllability of evaluation-use wafers has often been lacking in validity when evaluated.

It is therefore an object of the present invention to overcome the above and other deficiencies of the prior art and to provide methods for evaluating rule-based OPC and a simulation-based OPC model by which to determine line width controllability with precision.

DISCLOSURE OF INVENTION

In achieving the foregoing and other objects of the present invention and according to one aspect thereof, there is provided a rule-based OPC evaluating method including the steps of: obtaining correction data by correcting design data about an evaluation-use mask pattern through rule-based OPC; forming the evaluation-use mask pattern into an evaluation-use mask based on the correction data; forming evaluation-use gate patterns into an evaluation-use wafer using the evaluation-use mask; obtaining measured data about the evaluation-use gate patterns by measuring lengths of the evaluation-use gate patterns formed on the evaluation-use wafer; creating a simulation-based OPC model through execution of process calibration based both on test pattern design data about a test-use mask for process calibration purposes, and on measured data about gate patterns of a test-use wafer fabricated using the test-use mask; obtaining simulation data by simulating the design data about the evaluation-use mask pattern using the simulation-based OPC model; and evaluating the rule-based OPC by comparing the measured data about the evaluation-use gate patterns with the simulation data.

Practicing the rule-based OPC evaluating method according to the invention involves comparing the measured data about the evaluation-use gate patterns formed based on the rule-based OPC to be evaluated, with the simulation data obtained with regard to the design data about the evaluation-use mask pattern.

According to another aspect of the invention, there is provided a simulation-based OPC model evaluating method including: obtaining correction data by correcting design data about an evaluation-use mask pattern using a first simulation-based OPC model; forming the evaluation-use mask pattern into an evaluation-use mask based on the correction data; forming evaluation-use gate patterns into an evaluation-use wafer using the evaluation-use mask; obtaining measured data about the evaluation-use gate patterns by measuring lengths of the evaluation-use gate patterns formed on the evaluation-use wafer; creating a second simulation-based OPC model through execution of process calibration based both on test pattern design data about a test-use mask for process calibration purposes, and on measured data about gate patterns of a test-use wafer fabricated using the test-use mask; obtaining simulation data by simulating the design data about the evaluation-use mask pattern using the second simulation-based OPC model; and evaluating the first simulation-based OPC model by comparing the measured data about the evaluation-use gate patterns with the simulation data.

Practicing the inventive simulation-based OPC model evaluating method involves comparing the measured data about the evaluation-use gate patterns formed based on the first simulation-based OPC model to be evaluated, with the simulation data obtained relative to the design data about the evaluation-use mask pattern.

BEST MODE FOR CARRYING OUT THE INVENTION

How to implement the rule-based OPC evaluating method according to the invention will now be described.

Figure 2:
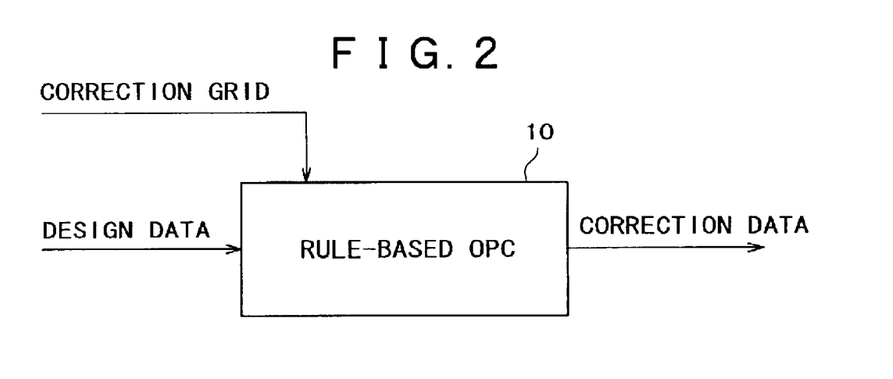
FIG. 2 is a block diagram of rule-based OPC.

FIG. 2 is a block diagram of rule-based OPC to be evaluated.

As shown in FIG. 2, rule-based OPC 10 is typically practiced by running software on a computer. Specifically, design data about a mask pattern are supplemented with bias data allowing for the optical proximity effect expected. The result is an output of correction data.

The rule-based OPC 10 has a correction grid established therein. The correction grid, the unit of the bias data, is a minimum increment in which to correct the mask pattern. It is on the basis of the correction grid that the correction data are output.

Figure 3:
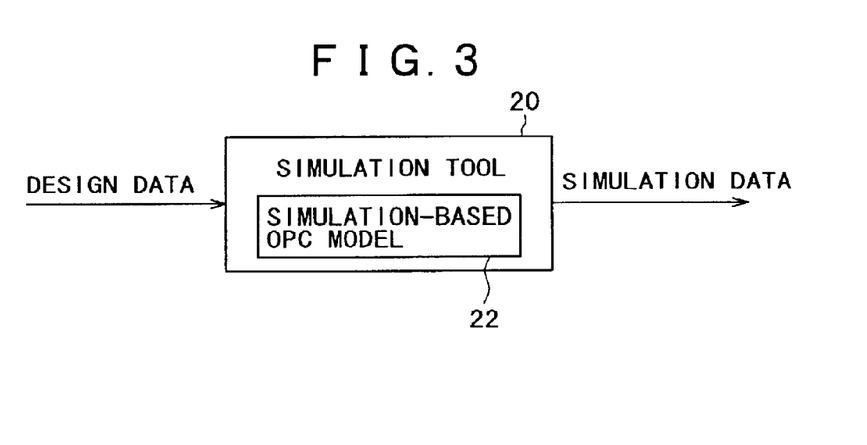
FIG. 3 is a block diagram of a simulation tool that generates and outputs simulation data for evaluating the rule-based OPC.

FIG. 3 is a block diagram of a simulation tool 20 that generates and outputs simulation data for evaluating the rule-based OPC 10.

The simulation tool 20, implemented by running suitable software on the computer, includes a simulation-based OPC model (kernel) 22 representing a mask pattern transfer process. The simulation-based OPC model 22 is generated by executing process calibration, to be described later.

The simulation tool 20 works as follows: as shown in FIG. 3, design data about desired patterns to be formed on a wafer (i.e., mask pattern design data) are first input to the simulation tool 20. Then tool 20 then simulates the design data based on the simulation-based OPC model 20 mentioned above, outputting simulation data representative of a mask pattern to be formed on the wafer.

Figure 1:
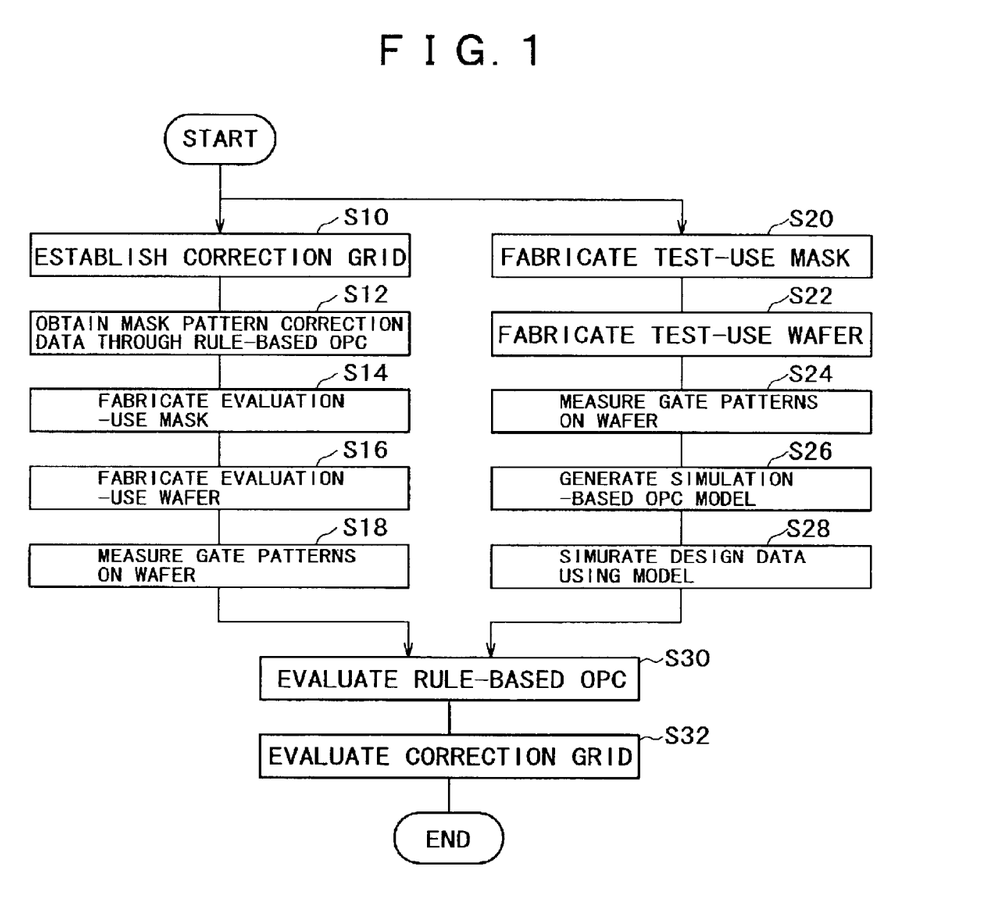
FIG. 1 is a flowchart of steps constituting a rule-based OPC evaluating method embodying the invention.

How the rule-based OPC is evaluated is described below in specific terms with reference to FIG. 1.

First of all, a correction grid is established in the rule-based OPC 10 (in step S10).

Next, mask pattern design data about an evaluation-use mask are input to the rule-based OPC 10. This produces correction data about the mask pattern on the evaluation-use mask (In step S12).

The evaluation-use mask is then fabricated based on the correction data (in step S14). In step S16, a wafer is exposed and etched through the evaluation-use mask, whereby an evaluation-use wafer is fabricated (in step S16).

And then, gate patterns on the evaluation-use wafer are measured for line width (in step S18).

Further, there exist a plurality of gate patterns having different line widths and different space dimensions relative to adjacent patterns. Since there are numerous (e.g., thousands of) gate patterns all over the evaluation-use wafer, some of the different gate patterns are selectively measured for line width.

On the other hand, apart from fabrication of the evaluation-use wafer, a test-use mask is fabricated based on test pattern design data about this mask preparatory to executing process calibration of the simulation-based OPC model (in step S20).

Next, a wafer is exposed and etched through the test-use mask. This produces the test-use wafer that bears test-use gate patterns (in step S22).

Gate patterns on the test-use wafer are then measured. This yields measured data (in step S24,).

It should be noted here that the measured data about the test-use wafer gate patterns have deviations from the test pattern design data about the test-use mask and that the deviations are representative of static variations caused by the optical proximity effect.

Figure 4:
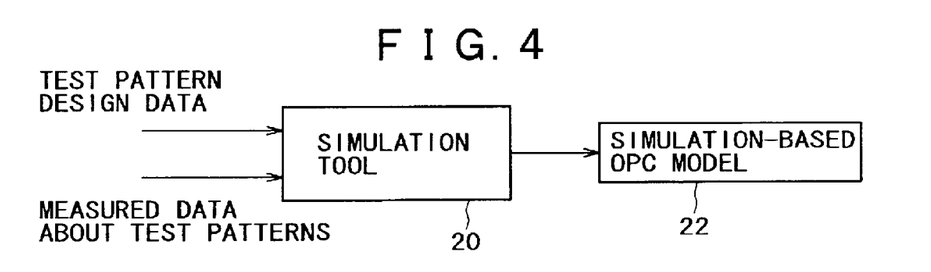
FIG. 4 is a block diagram of a simulation tool that generates a simulation-based OPC model.

As shown in FIG. 4, the test pattern design data about the test-use mask and the measured data about the gate patterns on the test-use wafer are thus input to the simulation tool 20. This allows the simulation tool 20 to generate a simulation-based OPC model 22 having undergone the process calibration allowing for the static variations caused by the optical proximity effect (In step S26).

Next, as indicated in FIG. 3, all mask pattern design data about the evaluation-use mask are input to the simulation tool 20. This causes the simulation tool 20 to simulate the input design data based on the simulation-based OPC model 22, outputting simulation data corresponding to the gate patterns all over the evaluation-use wafer (In step S28).

The rule-based OPC 10 is then evaluated by comparing the measured data about the evaluation-use gate patterns following the data acquisition in step S18 with the simulation data obtained in step S28 (in step S30).

Also, the correction grid established in step S10 is evaluated (in step S32).

Steps S30 and S32 above are described below in more detail with reference to FIGS. 5A through 5C and 6A through 6C.

Figure 5A:
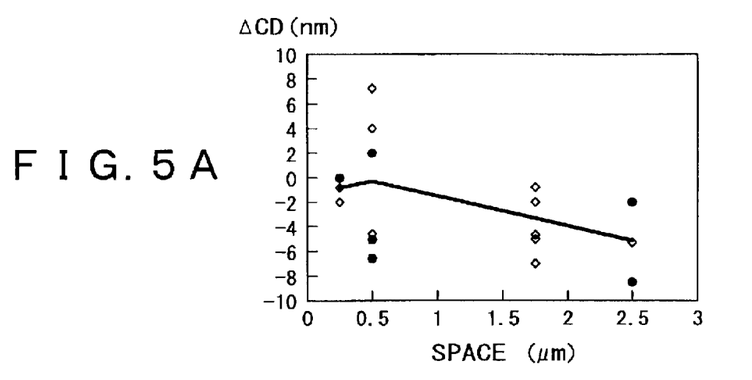
FIG. 5A is a diagram illustrating typical space dependency of measured data denoting line widths of evaluation-use gate patterns where a correction grid of 5 nm is established.

FIG. 5A is a diagram illustrating typical space dependency of measured data denoting line widths of evaluation-use gate patterns where a correction grid of 5 nm is established. The horizontal axis of FIG. 5A represents spaces ($\mu$m) between gate patterns, and the vertical axis denotes error CD (nm) of measured data about the line widths relative to design data. In FIG. 5A, solid lines stand for mean values of the measured data.

As shown in FIG. 5A, the average of the measured data about each of the different spaces falls within the range of ±5 nm. This is a satisfactory result given the fact that the correction grid is set for 5 nm.

Further, the measured data about each of the different spaces deviate by ±5 nm on both sides (i.e., positive and negative) of gate pattern line widths. The deviations are deemed acceptable if they fall within double the correction grid in both its positive and negative directions, i.e., ±2 times 5 nm (=±10 nm). FIG. 5A shows the deviations falling within the range of ±10 nm, which is considered satisfactory.

Next, a check is needed on whether the measured data in FIG. 5A are acceptable as line width data about the gate patterns on the evaluation-use wafer. The check is carried out by comparing the measured data with simulation data.

Figure 5B:
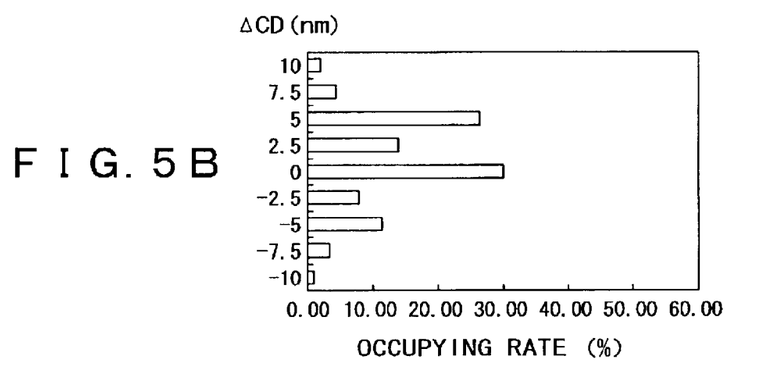
FIG. 5B is a distribution chart showing distribution of simulation data about all gate patterns on an evaluation-use wafer.

FIG. 5B is a distribution chart showing distribution of the simulation data about all gate patterns on the evaluation-use wafer following the data acquisition in step S28 above. The horizontal axis of FIG. 5B represents occupying rates (%) of the simulation data with respect to all gate patterns, and the vertical axis denotes simulation data error CD (nm) of the line width measurements relative to the design data.

As illustrated in FIG. 5B, almost all simulation data are distributed within the ±5 nm range, which allows the measurements in FIG. 5A to be judged acceptable. This also makes it possible to judge the selection of gate patterns for measurement in step S18 to be satisfactory.

Figure 5C:
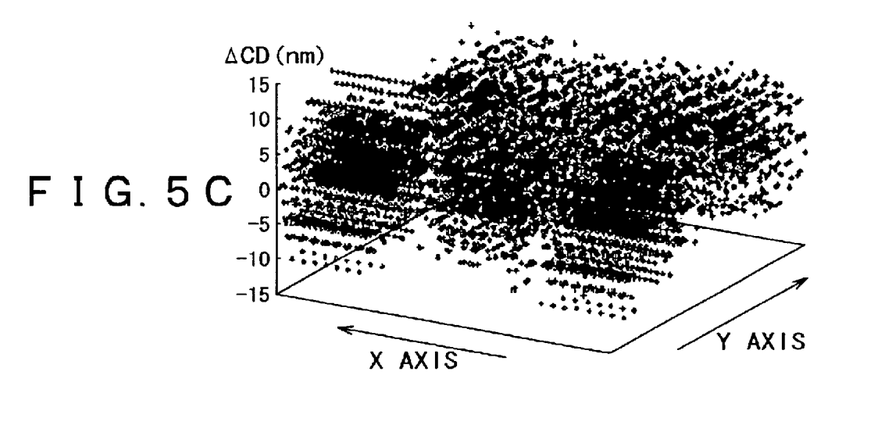
FIG. 5C is a distribution map depicting three-dimensional distribution of simulation data about all gate patterns on the evaluation-use wafer.

FIG. 5C is a distribution map depicting three-dimensional distribution of the simulation data about all gate patterns on the evaluation-use wafer following the data acquisition in step S28 above. The X and Y axes of FIG. 5C represent the two-dimensional coordinate axes on the evaluation-use wafer. A vertical axis (Z axis) perpendicular to the X and Y axes denotes simulation data error CD (nm) of the line width measurements relative to the design data.

Each of the points plotted in FIG. 5C corresponds to error CD of each of the gate patterns involved.

Figure 6A:
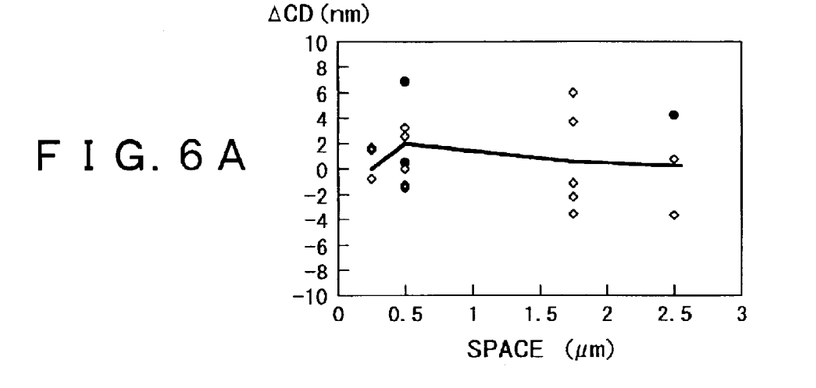
FIG. 6A a diagram illustrating typical space dependency of measured data denoting line widths of evaluation-use gate patterns where a correction grid of 2.5 nm is established.
Figure 6B:
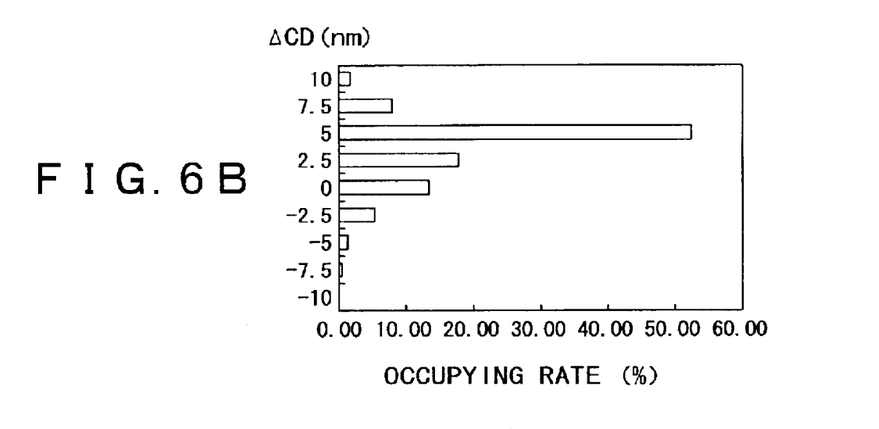
FIG. 6B is a distribution chart showing distribution of simulation data about all gate patterns on the evaluation-use wafer.
Figure 6C:
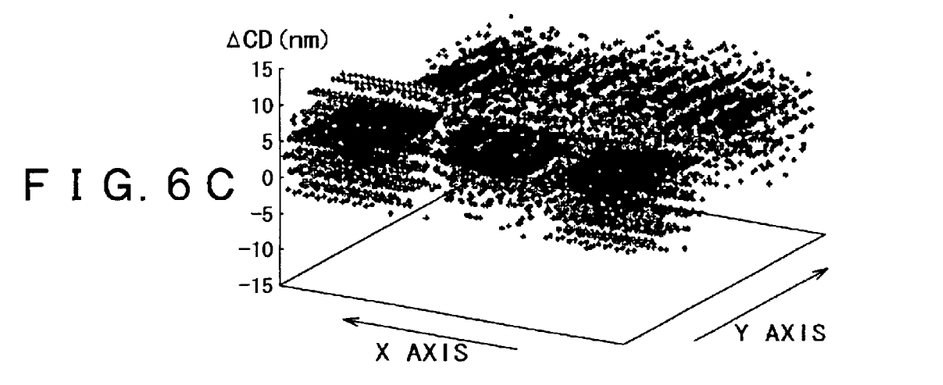
FIG. 6C is a distribution map depicting three-dimensional distribution of simulation data about all gate patterns on the evaluation-use wafer.

Described below with reference to FIGS. 6A through 6C is how evaluation is made in the same steps as those in the flowchart of FIG. 1, except that the correction grid is set for 2.5 nm instead of 5 nm.

FIGS. 6A through 6C correspond to FIG. 5A through 5C respectively.

As shown in FIG. 6A, the mean value measured per space falls within the ±2.5 nm range, which is deemed acceptable given the fact that the correction grid is set for 5 nm. The measured data per space deviate approximately within the range of ±2×2.5 nm (=±5 nm), which is considered satisfactory.

Comparing FIG. 6A with FIG. 6B reveals that almost all simulation data fall within the ±2.5 nm range. This proves that the measurements in FIG. 6A are satisfactory and that the selection of the gate patterns measured in step S18 above is acceptable.

A comparison of FIG. 5C with FIG. 6C shows the deviations in the latter to be less conspicuous along the vertical axis. That is, the error CD deviations of the simulation data in FIG. 6C are smaller than those shown in FIG. 5C.

As described above, the rule-based OPC evaluating method of this invention permits accurate evaluation of the line width controllability of the target rule-based OPC based on the measured data and simulation data.

The inventive method also makes it possible to determine whether the deviations of measured data fall within an acceptable range when the setting of the correction grid is changed. This affords optimization of the correction grid.

Deviation information about the simulation data regarding each of the gate patterns shown in FIGS. 5C and 6C may be fed back to the mask pattern layout design process. This provides a mask pattern design that minimizes errors in the gate patterns to be formed on the wafer.

Consider next the case where the correction grid is set for progressively smaller values.

Reducing the correction grid in size is supposed to lower deviations of measured data.

This, however, requires fabricating a wafer bearing gate patterns with gate line widths and space dimensions changed in units of the correction grid. It is also necessary to measure sizes of the gate patterns over the wafer.

Generally speaking, halving the correction grid size quadruples the number of measurements to be taken preparatory to building up rule-based OPC. It follows that if the correction grid is reduced from 2.5 nm to 0.5 nm, e.g., to one-fifth in size, the number of measurements to be taken is multiplied at least 16-fold. Measuring the size of every gate pattern on the wafer takes so much time (as long as one year) that the scheme is virtually impractical.

Under the circumstances, a simulation-based OPC model with no need for numerous measurements is used advantageously in reducing the correction grid size.

The simulation-based OPC model of interest can be evaluated in steps similar to those for evaluating the rule-based OPC discussed above.

Below is a description of how to implement a preferred simulation-based OPC model evaluating method according to the invention.

Figure 7:
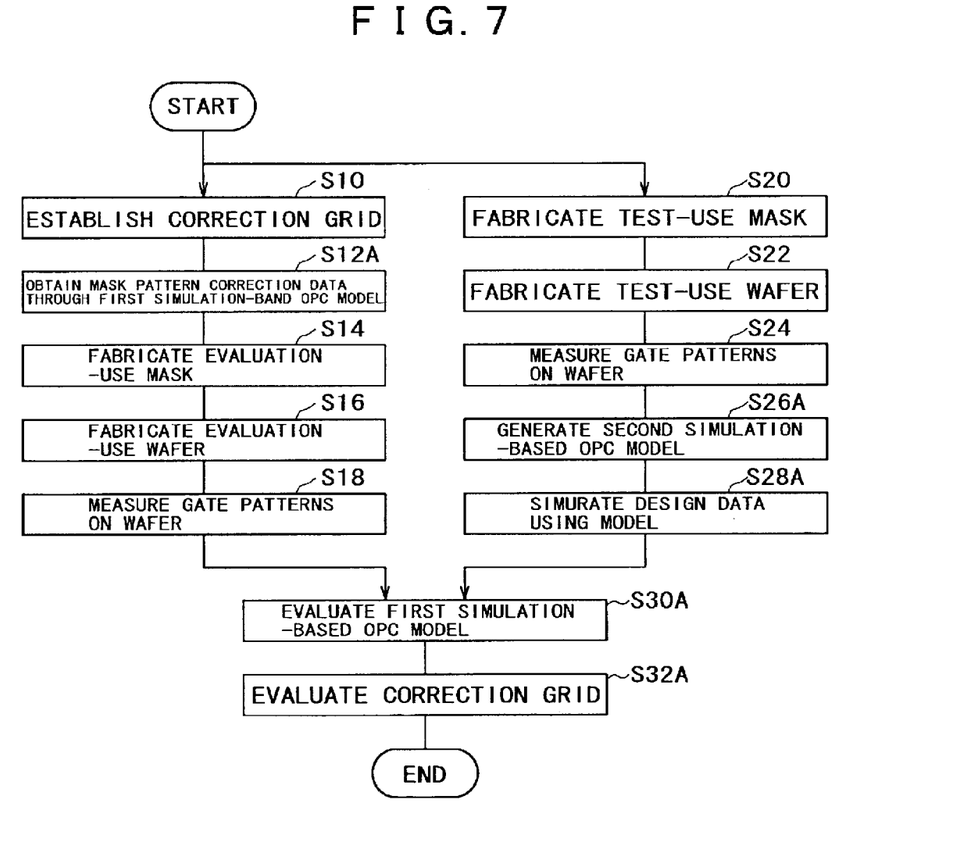
FIG. 7 is a flowchart of steps constituting a simulation-based OPC model evaluating method embodying the invention.

FIG. 7 is a flowchart of steps constituting the simulation-based OPC model evaluating method embodying the invention. In FIG. 7 as well as in FIG. 1, like reference numerals designate like or corresponding steps and their descriptions are simplified where redundant.

With this embodiment, as compared with the other embodiment discussed above, the simulation-based OPC model to be evaluated is referred to as a first simulation-based OPC model; the simulation-based OPC model for generating simulation data about the gate patterns on the evaluation-use wafer is called a second simulation-based OPC model; and simulation tools for the first and the second simulation-based OPC models are called a first and a second simulation tool, respectively.

Figure 8:
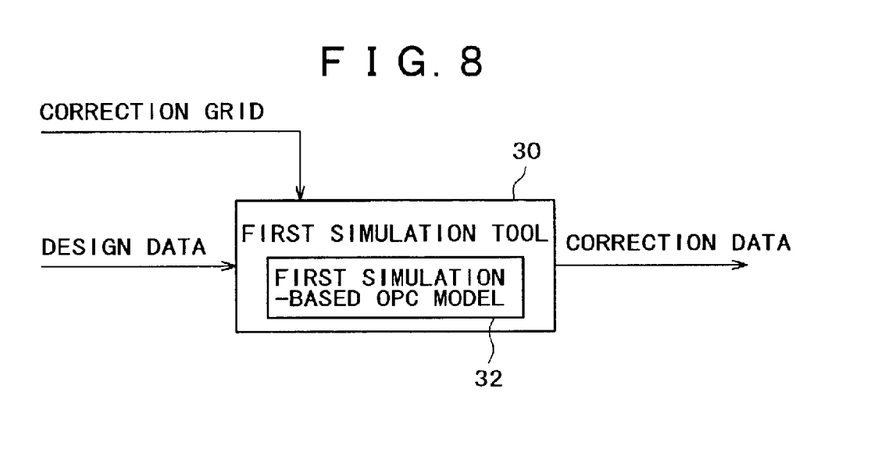
FIG. 8 is a block diagram of a first OPC simulation tool.

First of all, a correction grid in FIG. 7 is established in a first rule-based OPC 30, as shown in FIG. 8 (in step S10).

Next, mask pattern design data about an evaluation-use mask are input to the rule-based OPC 30. This produces correction data about the mask pattern on the evaluation-use mask (in step S12A).

The evaluation-use mask is then fabricated based on the correction data (in step S14). A wafer is exposed and etched through the evaluation-use mask, whereby an evaluation-use wafer is fabricated (in step S16,). Gate patterns on the evaluation-use wafer are measured for line width (in step S18).

On the other hand, apart from fabrication of the evaluation-use wafer, a test-use mask is fabricated based on test pattern design data about this mask preparatory to executing process calibration of the second simulation-based OPC model (in step S20). A wafer is exposed and etched through the test-use mask to produce the test-use wafer (in step S22). Gate patterns on the test-use wafer are measured, whereby measured data are obtained (in step S24).

Figure 10:
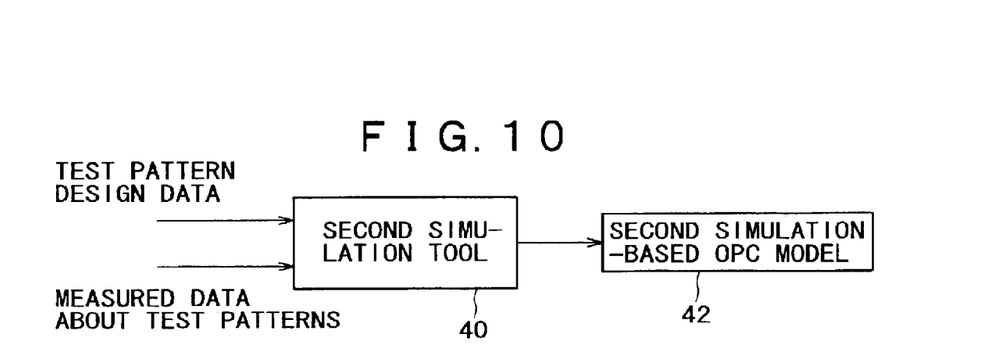
FIG. 10 is a block diagram of a second simulation tool that generates and outputs simulation data for evaluating the first simulation-based OPC model.

As shown in FIG. 10, the test pattern design data about the test-use mask and the measured data about the gate patterns on the test-use wafer are thus input to a second simulation tool 40. This allows the second simulation tool 40 to generate a second simulation-based OPC model 42 having undergone the process calibration allowing for the static variations caused by the optical proximity effect (in step S26A).

Figure 9:
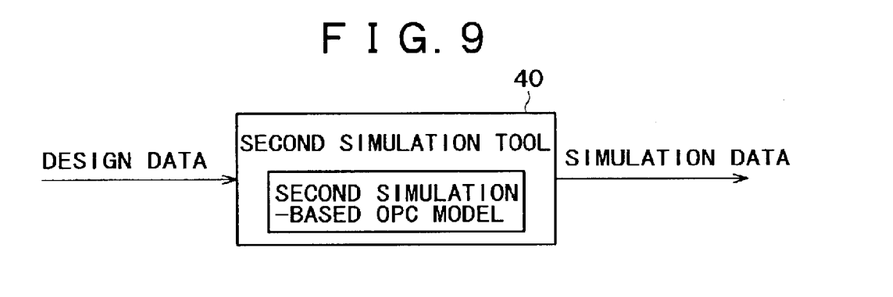
FIG. 9 is a block diagram of a second simulation tool that generates a second simulation-based OPC model.

As indicated in FIG. 9, all mask pattern design data about the evaluation-use mask are next input to the second simulation tool 40. This causes the second simulation tool 40 to simulate the input design data based on the second simulation-based OPC model 42, outputting simulation data corresponding to the gate patterns all over the evaluation-use wafer (in step S28A).

Then, the first simulation-based OPC model 32 is evaluated by comparing the measured data about the evaluation-use gate patterns following the data acquisition in step S18 with the simulation data obtained in step S28A (in step S30A).

Also, the correction grid established in step S10 is evaluated (in step S32A).

Steps S30A and S32A above are described below in more detail with reference to FIGS. 11A through 11C.

Figure 11A:
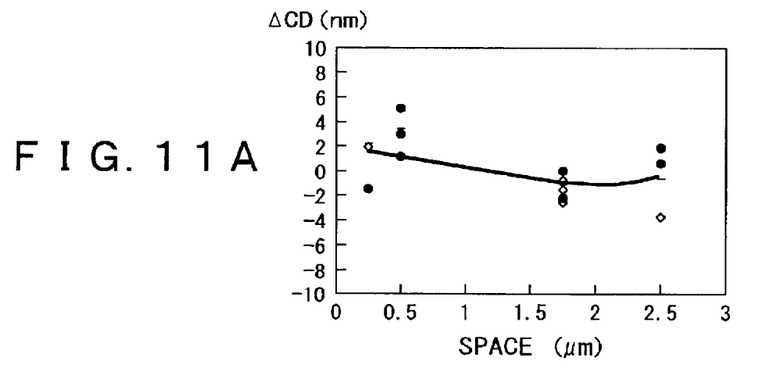
FIG. 11A is a diagram illustrating typical space dependency of measured data denoting line widths of the evaluation-use gate patterns where a correction grid of 0.5 nm is established.

FIG. 11A is a diagram illustrating typical space dependency of measured data denoting line widths of evaluation-use gate patterns where a correction grid of 0.5 nm is established. The horizontal axis of FIG. 11A represents spaces ($\mu$m) between gate patterns, and the vertical axis denotes error CD (nm) of measured data about the line widths relative to design data. In FIG. 11A, solid lines stand for mean values of the measured data.

As shown in FIG. 11A, the average of the measured data about each of the different spaces falls within the range of ±2.5 nm. It can be seen that the range of the mean value measured per space is further reduced compared with what is shown in FIG. 6A where the correction grid is set for 2.5 nm.

Next, it is necessary here to determine whether the measured data in FIG. 11A are acceptable through comparison with simulation data.

Figure 11B:
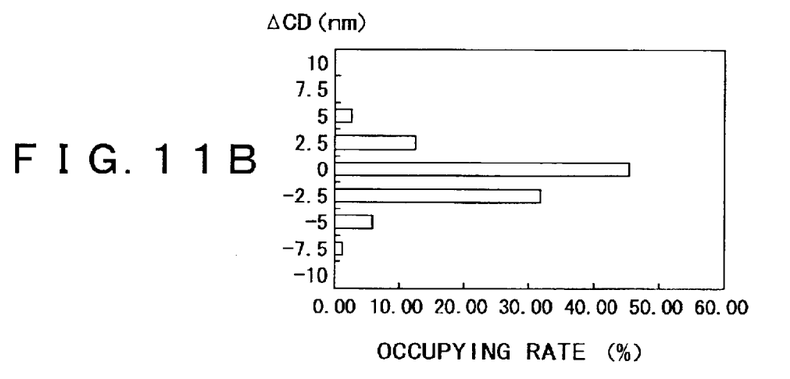
FIG. 11B is a distribution chart showing distribution of simulation data about all gate patterns on the evaluation-use wafer.

FIG. 11B is a distribution chart showing distribution of the simulation data about all gate patterns on the evaluation-use wafer following the data acquisition in step S28A above. The horizontal axis of FIG. 11B represents occupying rates (%) of the simulation data with respect to all gate patterns, and the vertical axis denotes simulation data error CD (nm) of the line width measurements relative to the design data.

As illustrated in FIG. 11B, almost all simulation data are distributed within the ±2.5 nm range, which allows the measurements in FIG. 11A to be judged acceptable. This also makes it possible to judge the selection of gate patterns for measurement in step S18A to be satisfactory.

Figure 11C:
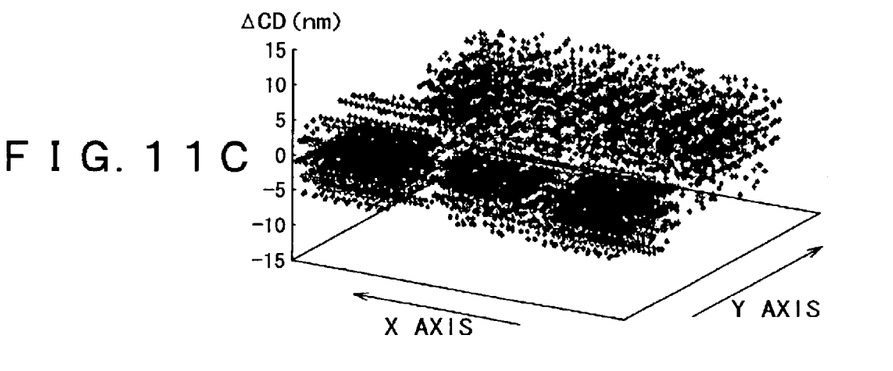
FIG. 11C is a distribution map depicting three-dimensional distribution of simulation data about all gate patterns on the evaluation-use wafer.

FIG. 11C is a distribution map depicting three-dimensional distribution of the simulation data about all gate patterns on the evaluation-use wafer following the data acquisition in step S28A above. The X and Y axes of FIG. 11C represent the two-dimensional coordinate axes on the evaluation-use wafer. A vertical axis (Z axis) perpendicular to the X and Y axes denotes simulation data error CD (nm) of the line width measurements relative to the design data.

A comparison of FIG. 6C with FIG. 11C shows the deviations in the latter to be less prominent along the vertical axis. That is, the error CD deviations of the simulation data in FIG. 11C are smaller than those shown in FIG. 6C.

As described above, the simulation-based OPC model evaluating method of this invention permits accurate evaluation of the line width controllability of the target simulation-based OPC model based on the measured data and simulation data.

The inventive method also makes it possible to determine whether the deviations of measured data fall within an acceptable range when the setting of the correction grid is changed. This affords optimization of the correction grid.

Deviation information about the simulation data regarding each of the gate patterns shown in FIG. 11C may be fed back to the mask pattern layout design process. This provides a mask pattern design that minimizes errors in the gate patterns to be formed on the wafer.

As described above, the rule-based OPC evaluating method of this invention permits accurate evaluation of the line width controllability of the rule-based OPC based on the measured data and simulation data.

Furthermore, the simulation-based OPC model evaluating method according to this invention provides accurate evaluation of the line width controllability of the simulation-based OPC model based on the measured data and simulation data.

What is claimed is:

1. A rule-based OPC evaluating method comprising the steps of:
    obtaining correction data by correcting design data about an initial mask pattern through rule-based OPC;
    forming said initial mask pattern into an initial mask based on said correction data;
    forming gate patterns into an initial wafer using said initial mask;
    obtaining measured data about said initial gate patterns by measuring lengths of said initial gate patterns formed on said initial wafer;
    creating a simulation-based OPC model through execution of process calibration based both on test pattern design data about a test-use mask for process calibration purposes, and on measured data about gate patterns of a test-use wafer fabricated using said test-use mask;

obtaining simulation data by simulating said design data about said initial mask pattern using said simulation-based OPC model;

evaluating said rule-based OPC by comparing said measured data about said initial gate patterns with said simulation data; and establishing a correction grid constituting a minimum increment in which to correct said mask pattern, wherein said design data about said initial mask pattern are corrected based on said correction grid.

2. A rule-based OPC evaluating method according to claim 1, wherein said measured data and said simulation data represent line widths.

3. A rule-based OPC evaluating method according to claim 1, wherein all of said design data are simulated using said simulation-based OPC model.

4. A simulation-based OPC model evaluating method according to claim 3, wherein said measured data and said simulation data represent line widths.

5. A simulation-based OPC model evaluating method according to claim 3, wherein all of said design data are simulated using said second simulation-based OPC model.

6. A simulation-based OPC model evaluating method according to claim 1, further comprising the step of comparing said measured data with said simulation data to evaluate said correction grid established in said correction grid establishing step.

* * * * *